United States Patent
Kaida et al.

(10) Patent No.: US 8,247,953 B2
(45) Date of Patent: Aug. 21, 2012

(54) PIEZOELECTRIC OSCILLATOR PART

(75) Inventors: Hiroaki Kaida, Moriyama (JP); Toru Kizu, Moriyama (JP); Akihiro Mitani, Yasu (JP); Eitaro Kameda, Moriyama (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 113 days.

(21) Appl. No.: 12/850,981

(22) Filed: Aug. 5, 2010

(65) Prior Publication Data

US 2010/0314971 A1 Dec. 16, 2010

Related U.S. Application Data

(63) Continuation of application No. PCT/JP2009/001438, filed on Mar. 30, 2009.

(30) Foreign Application Priority Data

Mar. 31, 2008 (JP) ................................ 2008-091467

(51) Int. Cl.
*H01L 41/053* (2006.01)
*H01L 41/047* (2006.01)

(52) U.S. Cl. ........................................ 310/348; 310/366

(58) Field of Classification Search .................. 310/348, 310/365, 366
See application file for complete search history.

(56) References Cited

U.S. PATENT DOCUMENTS

| 2005/0184625 A1* | 8/2005 | Miyazaki | 310/348 |
| 2010/0066210 A1* | 3/2010 | Otake | 310/348 |
| 2010/0207696 A1* | 8/2010 | Sayama | 331/158 |
| 2010/0207697 A1* | 8/2010 | Sayama | 331/158 |
| 2010/0308697 A1* | 12/2010 | Aratake et al. | 310/348 |

FOREIGN PATENT DOCUMENTS

| JP | 7-74851 | 3/1995 |
| JP | 8-204491 A | 8/1996 |
| JP | 10-303677 A | 11/1998 |
| JP | 2001-110925 A | 4/2001 |
| JP | 2002009578 A | 1/2002 |
| JP | 2002064159 A | 2/2002 |
| JP | 2004-40400 | 2/2004 |
| JP | 2004-328553 A | 11/2004 |
| JP | 2005123736 A | 5/2005 |

OTHER PUBLICATIONS

PCT/JP2009/001438 International Search Report dated Jun. 9, 2009.
PCT/JP2009/001438 Written Opinion dated Jun. 9, 2009.

* cited by examiner

*Primary Examiner* — Thomas Dougherty
(74) *Attorney, Agent, or Firm* — Dickstein Shapiro LLP (57) ABSTRACT

A piezoelectric oscillator part capable of suppressing oscillation that leaks from a piezoelectric oscillator to a substrate side is obtained. The piezoelectric oscillator part has a piezoelectric oscillator held on a substrate by first and second conductive holding members. The first conductive holding member is arranged proximal to a first end of the substrate. A terminal electrode connected to the first conductive holding member is arranged proximal to a second end of the substrate opposite the first end. The first conductive holding member and the terminal electrode are electrically connected by a wiring electrode.

10 Claims, 5 Drawing Sheets

PIEZOELECTRIC OSCILLATOR PART

CROSS REFERENCE TO RELATED APPLICATIONS

The present application is a continuation of International Application No. PCT/JP2009/001438, filed Mar. 30, 2009, which claims priority to Japanese Patent Application No. JP2008-091467, filed Mar. 31, 2008, the entire contents of each of these applications being incorporated herein by reference in their entirety.

FIELD OF THE INVENTION

The present invention relates to a piezoelectric oscillator part used in, for example, a piezoelectric resonator part or piezoelectric actuator, and more specifically to a piezoelectric oscillator part with a structure in which a piezoelectric oscillator is mounted on a substrate so as to be able to oscillate by the piezoelectric effect.

BACKGROUND OF THE INVENTION

Hitherto, various piezoelectric oscillator parts have been proposed as oscillators or filters. A piezoelectric oscillator part, in which a piezoelectric oscillator oscillates, requires a packaging structure which does not hinder the oscillation of the piezoelectric oscillator. The piezoelectric oscillator part disclosed in Patent document 1 employs a packaging structure constituted by a case substrate and a cap.

Figure 8A:
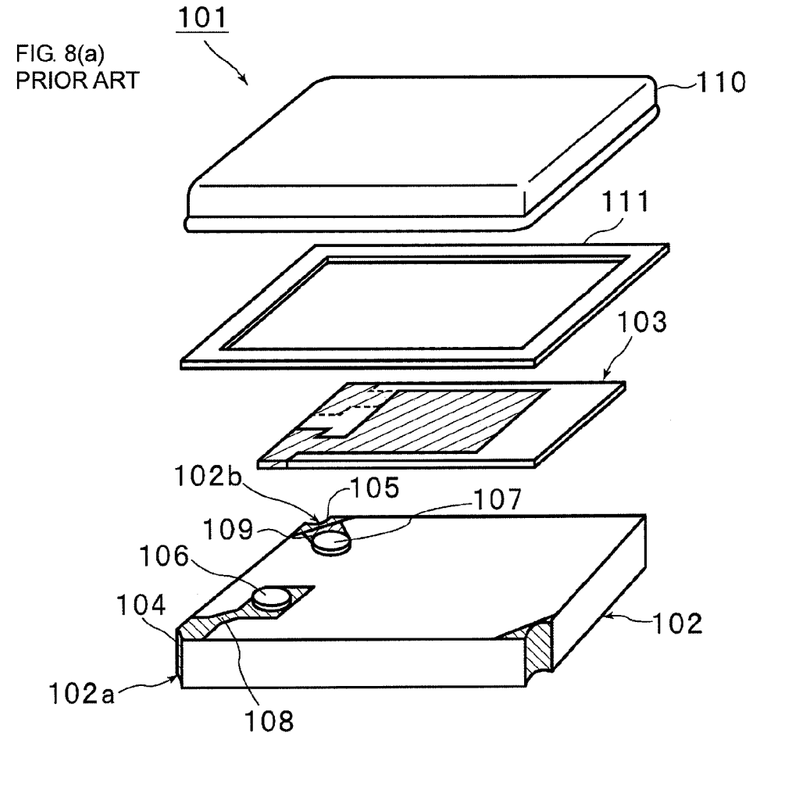
FIGS. 8(a) and 8(b) are exploded perspective views of an exemplary conventional piezoelectric oscillator part.
Figure 8B:
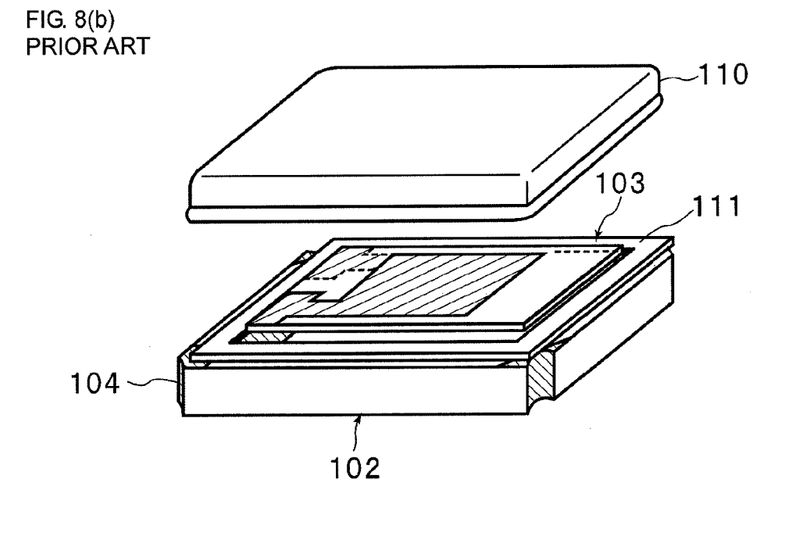

FIGS. 8(a) and 8(b) are exploded perspective views of a conventional piezoelectric oscillator part having such a packaging structure. A piezoelectric oscillator part 101 includes a piezoelectric oscillator 103 mounted on a case substrate 102. Here, first and second terminal electrodes 104 and 105 for external electrical connection are formed in the first and second corner portions 102a and 102b of the case substrate 102. Conductive adhesive portions 106 and 107 are arranged on the surface of the case substrate 102. The conductive adhesive portions 106 and 107 are electrically connected to wiring electrodes 108 and 109. The piezoelectric oscillator 103 is fixed to the case substrate 102 with the conductive adhesive portions 106 and 107, and the piezoelectric oscillator 103 is electrically connected to the first and second terminal electrodes 104 and 105 via the wiring electrodes 108 and 109. The piezoelectric oscillator 103 is supported by the conductive adhesive portions 106 and 107 at one end thereof using a cantilever structure.

To form a space for preventing the oscillation of the above-described piezoelectric oscillator 103 from being hindered, a cap 110 having an opening therebelow is connected to the case substrate 102 with a frame-shaped adhesive layer 111 therebetween.

Hence, the piezoelectric oscillator 103 is sealed in a package formed by the case substrate 102 and the cap 110.

[Patent Document 1]: Japanese Unexamined Patent Application Publication No. 2001-110925.

Also in the piezoelectric oscillator part 101, similarly to other electronic parts, reduction in size is strongly required. However, in the piezoelectric oscillator part 101, a packaging structure having a sealed space, as described above, needs to be formed in order not to hinder the oscillation of the piezoelectric oscillator 103. Hence, reduction in the size of the piezoelectric oscillator part 101 has been limited.

Hence, to reduce the size of the piezoelectric oscillator part 101 as much as possible, in the case substrate 102, the distance between the conductive adhesive portion 106 and the first terminal electrodes 104, and the distance between the conductive adhesive portion 107 and the second terminal electrode 105 have conventionally been made as small as possible.

On the other hand, in the piezoelectric oscillator part 101, the oscillation of the piezoelectric oscillator 103 is apt to leak to the case substrate 102 side through the junctions formed by the conductive adhesive portions 106 and 107. This leakage of oscillation may cause deterioration in resonance characteristics and the like.

SUMMARY OF THE INVENTION

An object of the present invention is to solve the above-described problems of the conventional technologies and to provide a piezoelectric oscillator part that allows not only reduction in size but also controlling the leakage of oscillation from the piezoelectric oscillator to the case side.

According to the present invention, a piezoelectric oscillator part is provided that includes: a substrate having an upper surface and a lower surface; a piezoelectric oscillator held on the upper surface of the substrate; a conductive holding member combining the substrate and the piezoelectric oscillator in such a manner as to hold the piezoelectric oscillator on the upper surface of the substrate at one end of the substrate, the conductive holding member being electrically connected to the piezoelectric oscillator; a terminal electrode provided close to another end of the substrate; and a wiring electrode provided on the upper surface of the substrate in such a manner as to connect the conductive holding member and the terminal electrode.

In the piezoelectric oscillator part according to the present invention, the above-described piezoelectric oscillator is held on the upper surface of a substrate, but this holding method is not limited a specific method. In a specific aspect of the present invention, the piezoelectric oscillator is supported by the above-described conductive holding member on the upper surface of the substrate using a cantilever structure. In this case, the displacement caused by the piezoelectric oscillator may be made larger. In addition, the supporting structure is simplified.

In another specific aspect of the piezoelectric oscillator part according to the present invention, the substrate has a shape of a rectangular plane having a first side and a second side facing each other, and a third side and a fourth side facing each other; and the conductive holding member is arranged close to the first side, and the terminal electrode is arranged close to the second side. Since, in the substrate having the shape of a rectangular plane, the conductive holding member is formed close to the first side, and the terminal electrode is formed close to the second side on the opposite side, a long wiring electrode may be formed on the upper surface of the substrate.

In still another specific aspect of the piezoelectric oscillator part according to the present invention, the substrate has a shape of a rectangular plane having a first side and a second side facing each other, and a third side and a fourth side facing each other; and the conductive holding member includes a first conductive holding member arranged close to the first side and a second conductive holding member arranged close to the second side. The piezoelectric oscillator is held on the upper surface of the substrate by the first and second conductive holding members; and the terminal electrode includes a first terminal electrode arranged close to the second side and a second terminal electrode arranged close to the first side. The wiring electrode includes a first wiring electrode and a second wiring electrode, and the first conductive holding member and the first terminal electrode are electrically connected by the first wiring electrode, and the second conductive holding member and the second terminal electrode are electrically connected by the second wiring electrode. In this case, the lengths of the first and second wiring electrodes may be made sufficiently long in the structure in which the piezoelectric oscillator is held by the first conductive holding member arranged close to the first side of the substrate and the second conductive holding member arranged close to the second side.

In still another specific aspect of the piezoelectric oscillator part according to the present invention, the piezoelectric oscillator part further includes a resin layer formed on the upper surface of the substrate in such a manner as to cover at least part of the wiring electrode. Hence, the leakage oscillation is damped by the resin layer.

In still another specific aspect of the piezoelectric oscillator part according to the present invention, the piezoelectric oscillator part further includes a cap, having an opening on the substrate side of the cap, fixed to the substrate using adhesive in such a manner as to surround the piezoelectric oscillator. Consequently, a piezoelectric oscillator part may be provided that has a packaging structure including a sealed space, formed in accordance with the present invention, for preventing the displacement of a piezoelectric oscillator from being hindered and that also allows for the suppression of leakage oscillation in accordance with the present invention.

Also in this structure, a resin layer formed on the upper surface of the substrate is preferably provided in such a manner as to cover at least part of the wiring electrodes, whereby the oscillation which leaks to the substrate side is damped by the resin layer. In this case, the adhesive for fixing the cap to the substrate may be made to function also as the above-described resin layer. In this case, it is not necessary to prepare a different material for forming the resin layer when the piezoelectric oscillator part with a cap is to be manufactured. Further, the resin layer may be formed at the same time as the cap combining operation.

In the piezoelectric oscillator part according to the present invention, since a conductive holding member is provided close to one end of the substrate and a terminal electrode is provided close to the other end of the substrate, a sufficiently long wiring electrode may be formed. This allows oscillation that leaks from the piezoelectric oscillator to the substrate side to be sufficiently attenuated while propagating through the long wiring electrode. In other words, the length of a path for attenuation of oscillation using the wiring electrode can be made long. Furthermore, since the length of the wiring electrode is increased by devising an effective positional relationship between the terminal electrode and the conductive holding member, the oscillation attenuation path length can be increased without increasing the dimensions of the substrate. Hence, a reduction in the size of a piezoelectric oscillator part is not prevented.

REFERENCE NUMERALS 1 piezoelectric oscillator part
2 case substrate
2a first short side
2b second short side
2c first long side
2d second long side
2e upper surface
3 first terminal electrode
4 second terminal electrode
5, 6 dummy electrodes
7, 8 wiring electrodes
9, 10 conductive holding members
11 piezoelectric oscillator
12 piezoelectric plate
13 first oscillation electrode
15, 16 terminal electrodes
17 cap
18 adhesive layer
20 resin layer
31 piezoelectric oscillator part
32 case substrate
32a, 32b first, second short sides
32c, 32d first, second long sides
33 first terminal electrode
34 second terminal electrode
35, 36 dummy electrodes
37, 38 wiring electrodes
39 first conductive holding member
40 second conductive holding member
41 piezoelectric oscillator
42 piezoelectric plate
43 first oscillation electrode
45 first terminal electrode
46 second terminal electrode
51 piezoelectric oscillator part

DETAILED DESCRIPTION OF THE INVENTION

Hereinafter, specific embodiments of the present invention are described to clarify the present invention with reference to the drawings.

Figure 1:
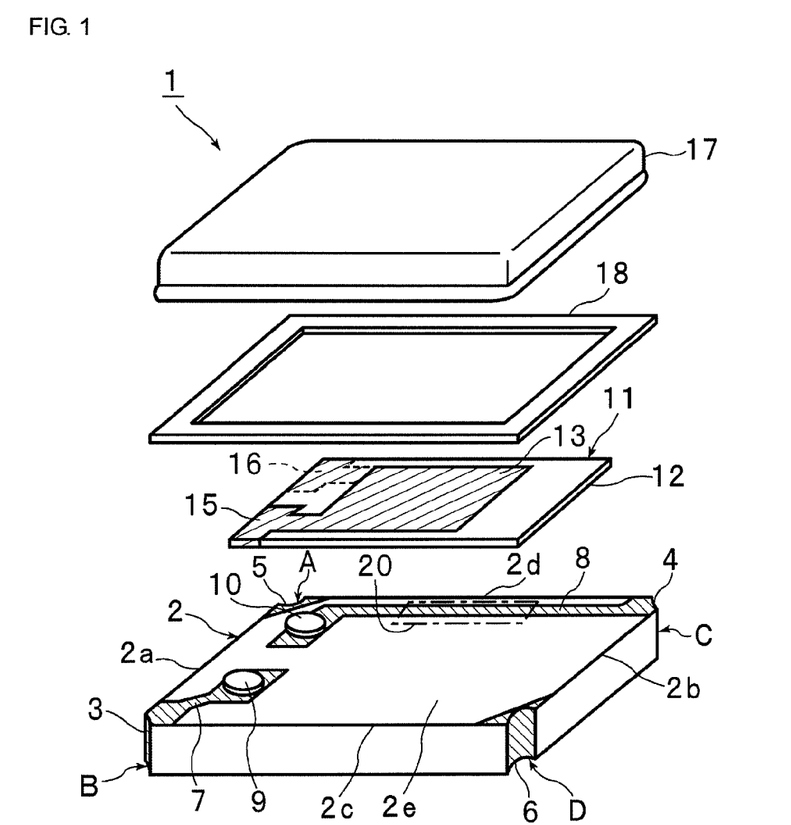
FIG. 1 is an exploded perspective view of a piezoelectric oscillator part according to a first embodiment of the present invention.
Figure 2:
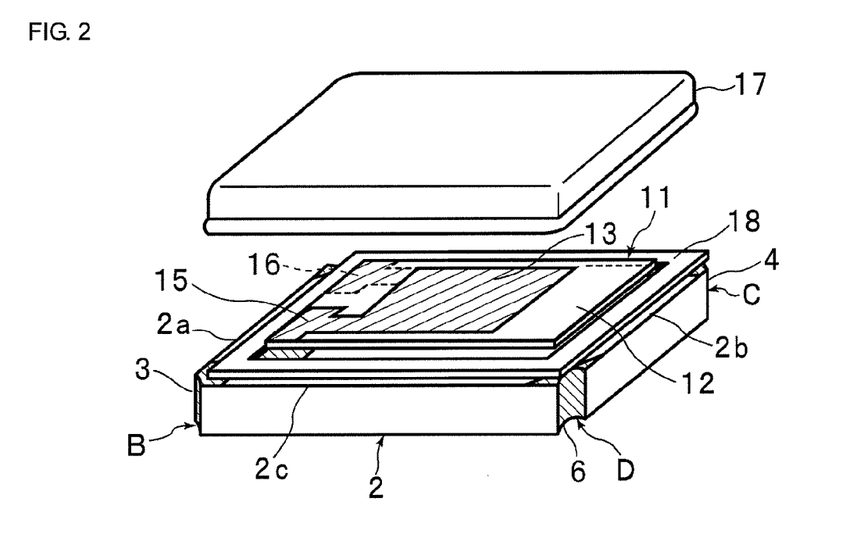
FIG. 2 is a perspective view for illustrating the process of combining a cap with a substrate at the time of manufacturing the piezoelectric oscillator part according to the first embodiment.

FIG. 1 is an exploded perspective view of a piezoelectric oscillator part according to a first embodiment of the present invention, and FIG. 2 is a perspective view for illustrating the process of combining the piezoelectric oscillator part with a cap thereof.

A piezoelectric oscillator part 1 includes a case substrate 2 having the shape of an approximately rectangular plane. The rectangular-shaped plane has first and second short sides 2a and 2b facing each other, and first and second long sides 2c and 2d facing each other. The four corner portions of the case substrate 2 are respectively denoted by first to fourth corner portions A to D. The corner portions A and B are corner portions located at the respective ends of the first short side 2a, and the corner portions C and D are corner portions located at the respective ends of the second short side 2b. The first long side 2c is located between the corner portions B and D, and the second long side 2d is located between the corner portions A and C.

In each of the corner portions A to D, a portion of the case substrate 2 is cut off to form a concavity having a cylindrical curved surface. Each of the concavities, is provided with a conductive material to form an electrode. In other words, a first terminal electrode 3 is formed in the corner portion B, and a second terminal electrode 4 is formed in the corner portion C. Dummy electrodes 5 and 6 are respectively formed in the corner portions A and D.

The dummy electrodes 5 and 6 need not be formed. However, the operation of providing an electrode material for forming the terminal electrodes 3 and 4 becomes easier when electrodes are formed in all of the corner portions A to D, as in the present embodiment.

On the upper surface 2e of the case substrate 2, first and second wiring electrodes 7 and 8 are formed so as to be connected, each at one end thereof, to the first and second terminal electrodes 3 and 4, respectively. First and second conductive holding members 9 and 10 are arranged at the other end thereof of each of the wiring electrodes 7 and 8.

Examples of the materials which can be used for forming the first and second wiring electrodes 7 and 8, the terminal electrodes 3 and 4, and the dummy electrodes 5 and 6 include appropriate metals such as Ag and Ag—Pd alloy, although not limited to specific materials.

Using the first and second conductive holding members 9 and 10, a piezoelectric oscillator 11 is fixed to the case substrate 2 in such a manner as to be supported by a cantilever structure.

The piezoelectric oscillator 11 includes a rectangular piezoelectric plate 12, a first oscillation electrode 13 formed on the first main surface of the piezoelectric plate 12, a second oscillation electrode (not shown) formed on the second main surface of the piezoelectric plate 12 so as to face the first oscillation electrode 13 with the piezoelectric plate 12 therebetween. The piezoelectric plate 12, which is made of a piezoelectric ceramic or crystal, oscillates in, for example, a thickness extensional mode. Hence, by applying an alternating voltage across the first oscillation electrode 13 and the second oscillation electrode, the piezoelectric oscillator 11 oscillates in a thickness extensional mode.

In the piezoelectric oscillator 11, the first oscillation electrode 13 is electrically connected to a terminal electrode 15 provided in one of the corner portions of the piezoelectric plate 12. The terminal electrode 15 is positioned above the first conductive holding member 9.

On the other hand, a second terminal electrode 16 electrically connected to the second oscillation electrode formed on the lower surface of the piezoelectric plate 12 is provided in the vicinity of another corner portion of the piezoelectric plate 12. The second conductive holding member 10 is positioned below the second terminal electrode 16. Hence, by combining the piezoelectric oscillator 11 with the case substrate 2 with the first and second conductive holding members 9 and 10, the terminal electrodes 15 and 16 are respectively connected to the first and second terminal electrodes 3 and 4.

As described above, the first and second conductive holding members 9 and 10 mechanically support the piezoelectric oscillator 11, and also electrically connect the first oscillation electrode 13 and the second oscillation electrode of the piezoelectric oscillator 11 respectively to the first and second terminal electrodes 3 and 4 provided on the case substrate 2.

A cap 17 having an opening therebelow is combined with the upper surface 2e of the case substrate 2 using a rectangular-frame-shaped adhesive layer 18 so as to cover the piezoelectric oscillator 11. This seals the piezoelectric oscillator 11 in a package constituted by the case substrate 2 and the cap 17. The cap 17 is made of, for example, a composite material in which a metal film is formed on the surface of a metal or an insulating material.

In the piezoelectric oscillator part 1, the oscillation that leaks from the piezoelectric oscillator 11 to the case substrate 2 side is effectively suppressed because a second wiring electrode 8 is made sufficiently long. In other words, the second conductive holding member 10 is arranged on the one end side of the case substrate 2, more specifically, close to the first short side 2a, and the first terminal electrode 4 is arranged on the other end side, i.e., in the corner portion C located on the opposite side at the second short side 2b. Hence, the second wiring electrode 8 extends along the second long side 2d. Therefore, the second wiring electrode 8 is made sufficiently long, compared with the second wiring electrode 109 of the conventional piezoelectric oscillator part illustrated in FIG. 8. Consequently, when the oscillation leaking through the second conductive holding member 10 propagates over the second wiring electrode 8, the leakage oscillation is sufficiently attenuated. This makes it possible to improve the oscillation characteristics output from the first and second terminal electrodes 3 and 4.

In addition, in the piezoelectric oscillator part 1, a portion of the second wiring electrode 8 is covered with the adhesive layer 18. In the present embodiment, the adhesive layer 18 is made of epoxy adhesive, and since the adhesive layer 18 covers a portion of the second wiring electrode 8, the leakage oscillation is further attenuated due to the existence of the adhesive layer.

Note that a resin layer 20 may be formed at a location schematically shown by a one-dot chain line illustrated in FIG. 1 to attenuate the above-described leakage oscillation. In this case, the adhesive layer 18 need not cover the second wiring electrode 8. Materials used for forming such a resin layer may be the same as those used for forming the adhesive layer 18. Then the number of kinds of materials to be prepared is decreased, since the adhesive layer 18 and the resin layer 20 are made of the same material. In addition, the resin layer 20 may be formed using the same process as for the adhesive layer 18.

However, the resin layer 20 may be formed of a resin different from that of the adhesive layer 18. Examples of such resins include silicone, urethane resin, and polyimide.

Hereinafter, it is explained that the leakage oscillation is suppressed by forming the above-described resin layer, with reference to an illustration of the analysis result using a finite element method.

Figures 3A, 3B:
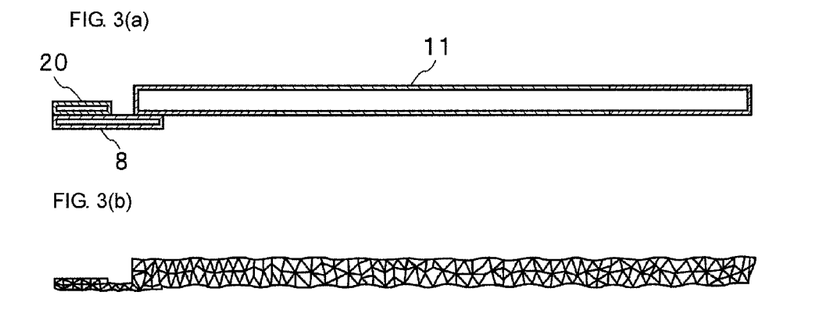
FIG. 3(a) is a schematic front sectional view of a finite-element-method-based analysis model of the piezoelectric part provided with a resin layer according to the first embodiment.
FIG. 3(b) illustrates the analysis result of the displacement distribution based on a finite element method.
Figures 4A, 4B:
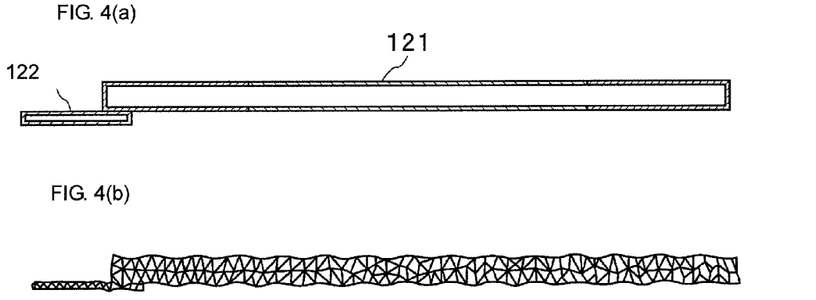
FIG. 4(a) a schematic front sectional view of a finite-element-method-based analysis model of a modification of the first embodiment having a configuration similar to the first embodiment except that the resin layer is not provided.
FIG. 4(b) illustrates the analysis result of the displacement distribution based on a finite element method.

FIGS. 4(a) and (b) illustrate the analysis result of a comparative example having a configuration similar to that of the above embodiment except that the resin layer is not provided, i.e., the rectangular-frame-shaped adhesive layer 18 is formed so as not to cover the second wiring electrode 8, where 4(*a*) is a schematic front sectional view of the analysis model, and 4(*b*) illustrates the analysis result of the displacement distribution based on a finite element method. On the other hand, FIG. 3(*a*) is a schematic front sectional view of the analysis model of the piezoelectric oscillator part of the above-described embodiment, and FIG. 3(*b*) is an illustration of the analysis result of the displacement distribution thereof.

In the analysis model illustrated in FIG. 4(*a*), a schematic structure is illustrated in which a wiring electrode 122 on the case substrate is located below a piezoelectric oscillator 121. In FIG. 3(*a*), a schematic structure is illustrated in which the resin layer 20 is formed on the second wiring electrode 8 on the case substrate located below the piezoelectric oscillator 11.

FIG. 4(*b*) shows that, compared with FIG. 3(*b*), the second wiring electrode is not displaced so much since the leakage oscillation is suppressed by formation of the resin layer 20. In other words, it can be seen that the leakage oscillation is effectively suppressed by formation of the resin layer 20.

Note that in the analysis illustrated in FIGS. 3(*b*) and 4(*b*), the following assumption was made: the piezoelectric oscillator is a crystal oscillator, the electrode material is Ag, the density of piezoelectric material is $1.04 \times 10^4$ kg/m$^3$, the Young's modulus is $7.32 \times 10^3$ Pa, and the mechanical attenuation (1/Qm) is $100 \times 10^{-3}$; and regarding the resin constituting the resin layer 20, the density is $1.2 \times 10^3$ kg/m$^3$, the Young's modulus is $4 \times 10^9$ Pa, and the mechanical attenuation (1/Qm) is 1.

Figure 5:
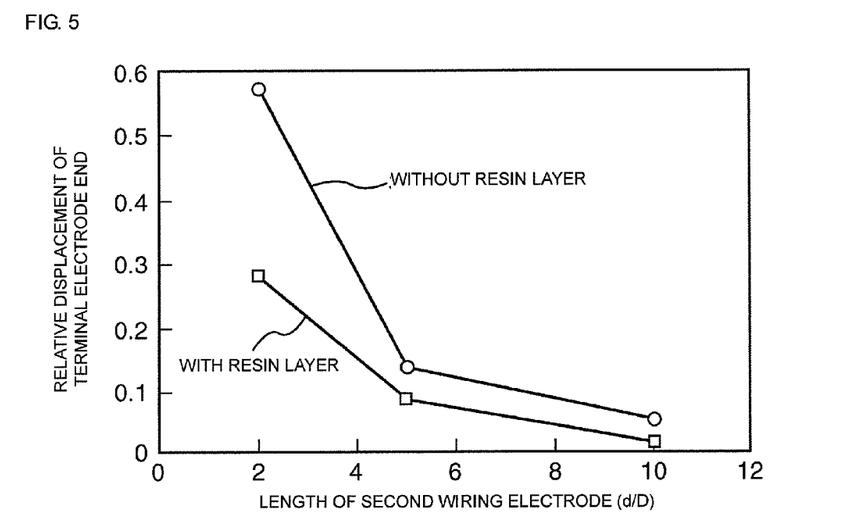
FIG. 5 illustrates the relation between the length of a wiring electrode and the relative displacement at the wiring electrode.

Further, the relation between the length d/D of the second wiring electrode on the case substrate and the relative displacement at the terminal electrode side end of the second wiring electrode has been obtained on the basis of the result of the analysis using a finite element method. This result is illustrated in FIG. 5. Note that the length d of the second wiring electrode is a value normalized by the width D of the piezoelectric oscillator, and the relative displacement is a value normalized by the maximum displacement of the piezoelectric oscillator 11.

As can be clearly seen from FIG. 5, the relative displacement at the terminal electrode side end of the second wiring electrode decreases as the length of the second wiring electrode increases. This shows that the relative displacement can be decreased in accordance with an increase in the length of the second wiring electrode both in the case of the modification in which the resin layer 20 is not provided, as indicated by ○, and in the case of the above-described embodiment in which the resin layer 20 is provided, as indicated by □.

In addition, it can be seen that according to the above-described embodiment in which the resin layer 20 is provided, compared with the modification in which the resin layer 20 is not provided, the relative displacement can be decreased by forming a resin layer when making a comparison of the second wiring electrodes of the same length.

Note that although the length of the second wiring electrode, among the first and second wiring electrodes, is increased in the present embodiment to suppress the leakage oscillation, the length of the first wiring electrode may instead be increased.

Furthermore, the resin layer 20 need not be formed in such a manner as to cover the whole lengthened wiring electrode, and may be formed in such a manner as to cover a portion of the first wiring electrode. Preferably, the resin layer is formed in such a manner as to cover portions of both the first and second wiring electrodes, thereby effectively suppressing the leakage oscillation.

Figure 6A:
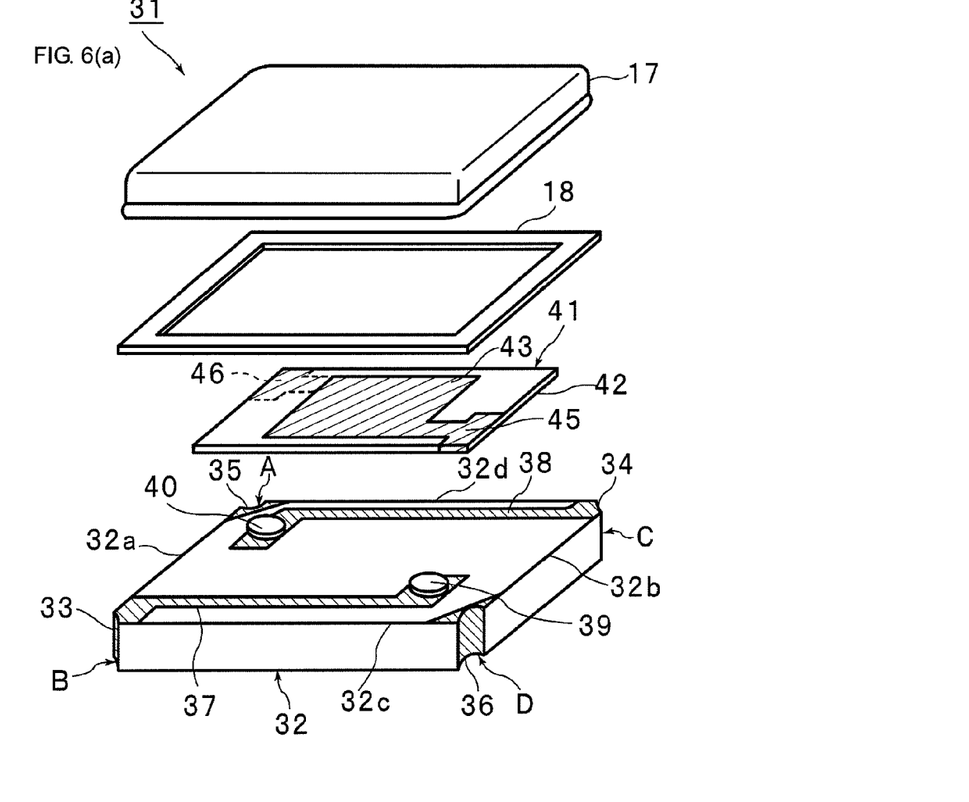
FIG. 6(a) is an exploded perspective view of a piezoelectric oscillator part according to a second embodiment of the present invention.
Figure 6B:
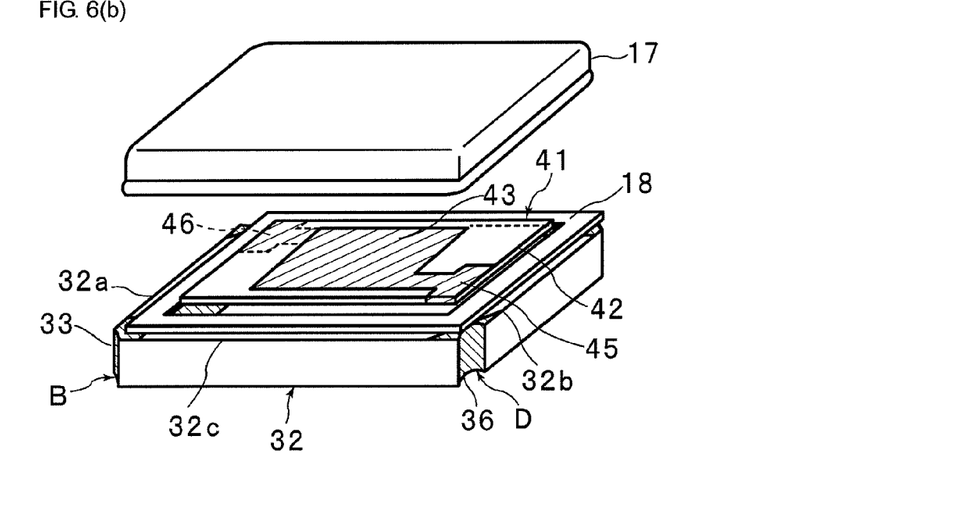
FIG. 6(b) is a perspective view for illustrating a cap combining process at the time of manufacturing the piezoelectric oscillator part according to the second embodiment.

FIG. 6(*a*) is an exploded perspective view of a piezoelectric oscillator part according to a second embodiment of the present invention, and FIG. 6(*b*) is a perspective view for illustrating the process of combining the piezoelectric oscillator part with a cap thereof.

In a piezoelectric oscillator part 31 according to the second embodiment, electrodes are formed in corner portions A to D of a case substrate 32 similarly to the case substrate 2 of the above-described embodiment. Here, a first terminal electrode 33 is formed in the corner portion B, and a second terminal electrode 34 is formed in the corner portion C, and dummy electrodes 35 and 36 are respectively formed in the corner portions A and D. In the present embodiment, a first wiring electrode 37 one end of which is connected to the first terminal electrode 33 and a second wiring electrode 38 one end of which is connected to the second terminal electrode 34 are formed in such a manner as to respectively have sufficient lengths. This is because a piezoelectric oscillator 41 is supported at one end and the other end thereof.

More specifically, the case substrate 32 has the shape of a rectangular plane. The rectangular-shaped plane has first and second short sides 32*a* and 32*b* facing each other, and first and second long sides 32*c* and 32*d* facing each other. The first terminal electrode 33 is arranged close to the first short side 32*a* and a first conductive holding member 39 is arranged close to the second short side 32*b*. Hence, the first wiring electrode 37 electrically connecting the first terminal electrode 33 and the first conductive holding member 39 has a sufficient length. Similarly, the second terminal electrode 34 is formed in the corner portion of the second short side 32*b*, and a second conductive holding member 40 is arranged close to the first short side 32*a*. Hence, the second wiring electrode 38 is formed in such a manner as to have a sufficient length similarly to the first embodiment.

The piezoelectric oscillator 41 has first and second terminal electrodes 45 and 46 respectively above the first and second conductive holding members 39 and 40. The first terminal electrode 45 extends from the upper surface of a piezoelectric plate 42 to the lower surface thereof via the side thereof. This portion which extends to the lower surface of the piezoelectric plate 42 is connected to the upper surface of the first conductive holding member 39, and they are electrically connected.

Note that also in the piezoelectric oscillator 41, the piezoelectric plate 42 is divided into two polarities in the thickness direction: a first oscillation electrode 43 is formed on the upper surface and a second oscillation electrode (not illustrated) is formed on the lower surface. The first and second terminal electrodes 45 and 46 are respectively connected to the first and second oscillation electrodes. The piezoelectric oscillator part 31 of the second embodiment is similar to that of the first embodiment except that the structure of supporting the piezoelectric oscillator 41 is different, as described above, and hence, the length of the first wiring electrode 37 and the position of the first conductive holding member 39 are different. Hence, description of the adhesive layer 18 and the cap 17 is omitted here and the description in the first embodiment is to be referred to.

Also in the present embodiment, since the second wiring electrode 38 has a sufficient length, the oscillation that leaks via the second conductive holding member 40 is attenuated while propagating through the second wiring electrode 38. In addition, also in the first wiring electrode 37, the leaking oscillation is sufficiently attenuated. Consequently, the oscillation is attenuated by both the first and second wiring electrodes 37 and 38 in the second embodiment, and hence, better resonance characteristics are obtained.

Further, also in the present embodiment, the adhesive layer 18 also plays the role of a resin layer that attenuates oscillation, and hence, the adhesive layer 18 is formed in such a manner as to cover part of the first and second wiring electrodes 37 and 38.

However, similarly to the first embodiment, a resin layer for attenuating the oscillation may be formed in such a manner as to cover at least a portion of at least one of the first and second wiring electrodes, separately from the adhesive layer 18.

Figure 7:
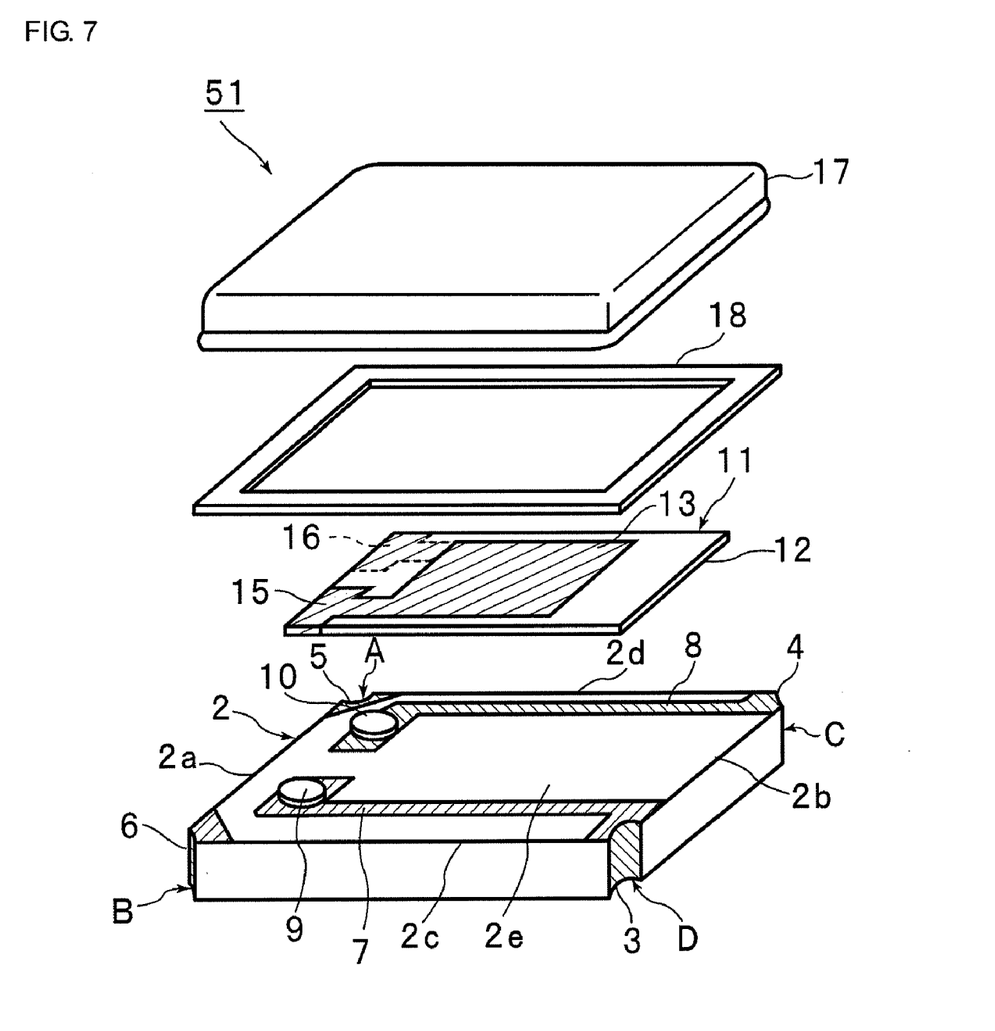
FIG. 7 is an explanatory exploded perspective view of a piezoelectric oscillator part according to a modification of the first embodiment.

Note that although the wiring electrode 8 is lengthened in the embodiment illustrated in FIG. 1, a first wiring electrode 7 may also be lengthened by being made to extend to a second short side 2b side, as in a piezoelectric oscillator part 51 of a modification of the embodiment illustrated in FIG. 7. Here, a terminal electrode 3 is arranged in the corner portion of the second short side 2b and a first long side 2c, and the wiring electrode 7 is electrically connected to the terminal electrode 3. Hence, in a corner portion B of a first short side 2a and the first long side 2c, a dummy electrode 6 is formed.

The piezoelectric oscillator part 51 is similar to the piezoelectric oscillator part 1 in other respects. In this manner, all the terminal electrodes may be formed close to one side of a piezoelectric substrate.

Although a piezoelectric oscillator is used in which the first and second oscillation electrodes are formed on part of the first and second main surfaces of the piezoelectric plate in the first and second embodiments, other types of piezoelectric oscillators may be used. In other words, various energy-confined piezoelectric oscillators may be used in the present invention.

The invention claimed is:

1. A piezoelectric oscillator part, comprising:
   a substrate having an upper surface and a lower surface;
   a piezoelectric oscillator;
   a conductive holding member connecting the substrate and the piezoelectric oscillator in such a manner as to hold the piezoelectric oscillator above the upper surface of the substrate, the conductive holding member being proximal to a first end of the substrate and electrically connected to the piezoelectric oscillator;
   a terminal electrode proximal to a second end of the substrate opposite the first end;
   a wiring electrode on the upper surface of the substrate and connecting the conductive holding member and the terminal electrode;
   a cap, having an opening on a substrate side thereof, fixed to the substrate so as to surround the piezoelectric oscillator; and
   a resin layer on the upper surface of the substrate covering at least part of the wiring electrode,
   wherein an adhesive fixes the cap to the substrate, the adhesive forming the resin layer.

2. The piezoelectric oscillator part according to claim 1, wherein the piezoelectric oscillator is held by the conductive holding member on the upper surface of the substrate in a cantilever manner.

3. The piezoelectric oscillator part according to claim 2, wherein the substrate has a shape of a rectangular plane having a first short side and a second short side facing each other, and a third long side and a fourth long side facing each other, and
   wherein the conductive holding member is arranged proximal to the first short side, and the terminal electrode is arranged proximal to the second short side.

4. The piezoelectric oscillator part according to claim 1, wherein the conductive holding member is a first conductive holding member, the terminal electrode is a first terminal electrode, and the wiring electrode is a first wiring electrode, the piezoelectric oscillator part further comprising:
   a second conductive holding member proximal to the second side of the substrate;
   a second terminal electrode proximal to the first side of the substrate;
   a second wiring electrode on the upper surface of the substrate and connecting the second conductive holding member and the second terminal electrode.

5. The piezoelectric oscillator part according to claim 4, wherein the first wiring electrode has a length sufficient to attenuate oscillation leakage from the first conductive holding member, and the second wiring electrode has a length sufficient to attenuate oscillation leakage from the second conductive holding member.

6. The piezoelectric oscillator part according to claim 1, further comprising a resin layer on the upper surface of the substrate and covering at least part of the wiring electrode.

7. The piezoelectric oscillator part according to claim 1, wherein the terminal electrode is provided in a concavity at a corner of the substrate.

8. The piezoelectric oscillator part according to claim 1, wherein the wiring electrode has a length sufficient to attenuate leakage oscillation from the conductive holding member.

9. A piezoelectric oscillator part, comprising:
   a substrate having an upper surface and a lower surface;
   a piezoelectric oscillator;
   a conductive holding member connecting the substrate and the piezoelectric oscillator in such a manner as to hold the piezoelectric oscillator above the upper surface of the substrate, the conductive holding member being proximal to a first end of the substrate and electrically connected to the piezoelectric oscillator;
   a terminal electrode proximal to a second end of the substrate opposite the first end; and
   a wiring electrode on the upper surface of the substrate and connecting the conductive holding member and the terminal electrode,
   wherein the conductive holding member is a first conductive holding member, the terminal electrode is a first terminal electrode, and the wiring electrode is a first wiring electrode, the piezoelectric oscillator part further comprising:
   a second conductive holding member proximal to the first end of the substrate;
   a second terminal electrode proximal to the second end of the substrate;
   a second wiring electrode on the upper surface of the substrate and connecting the second conductive holding member and the second terminal electrode.

10. The piezoelectric oscillator part according to claim 9, wherein the first wiring electrode has a length sufficient to attenuate oscillation leakage from the first conductive holding member, and the second wiring electrode has a length sufficient to attenuate oscillation leakage from the second conductive holding member.

* * * * *